(12) United States Patent
Zhou et al.

(10) Patent No.: US 9,721,807 B2
(45) Date of Patent: *Aug. 1, 2017

(54) CYCLIC SPACER ETCHING PROCESS WITH IMPROVED PROFILE CONTROL

(71) Applicant: Applied Materials, Inc., Santa Clara, CA (US)

(72) Inventors: Qingjun Zhou, San Jose, CA (US); Jungmin Ko, San Jacinto, CA (US); Tom Choi, Sunnyvale, CA (US); Sean Kang, San Ramon, CA (US); Jeremiah Pender, San Jose, CA (US); Srinivas D. Nemani, Sunnyvale, CA (US); Ying Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,117

(22) Filed: Mar. 24, 2016

(65) Prior Publication Data

US 2016/0293438 A1 Oct. 6, 2016

Related U.S. Application Data

(60) Provisional application No. 62/140,243, filed on Mar. 30, 2015.

(51) Int. Cl.
*H01L 21/311* (2006.01)
*H01L 21/3065* (2006.01)
*H01L 21/3213* (2006.01)
*H01L 21/033* (2006.01)

(52) U.S. Cl.
CPC .... *H01L 21/31116* (2013.01); *H01L 21/0337* (2013.01); *H01L 21/3065* (2013.01); *H01L 21/30655* (2013.01); *H01L 21/31105* (2013.01); *H01L 21/32136* (2013.01); *H01L 21/32137* (2013.01)

(58) Field of Classification Search
CPC ........... H01L 21/3065; H01L 21/30655; H01L 21/31105; H01L 21/32136
USPC ............. 438/696, 719, 724, 744; 216/71, 79
See application file for complete search history.

(56) References Cited

U.S. PATENT DOCUMENTS

| | | | |
|---|---|---|---|
| 6,949,481 B1 * | 9/2005 | Halliyal | G11C 16/0475 257/E21.21 |
| 9,478,433 B1 * | 10/2016 | Zhou | H01L 21/0337 |
| 2012/0052683 A1 * | 3/2012 | Kim | H01L 21/02126 438/694 |

(Continued)

*Primary Examiner* — Binh X Tran
(74) *Attorney, Agent, or Firm* — Patterson + Sheridan, LLP

(57) ABSTRACT

Embodiments described herein relate to methods for patterning a substrate. Patterning processes, such as double patterning and quadruple patterning processes, may benefit from the embodiments described herein which include performing an inert plasma treatment on a spacer material, performing an etching process on a treated region of the spacer material, and repeating the inert plasma treatment and the etching process to form a desired spacer profile. The inert plasma treatment process may be a biased process and the etching process may be an unbiased process. Various processing parameters, such as process gas ratios and pressures, may be controlled to influence a desired spacer profile.

17 Claims, 5 Drawing Sheets

(56) References Cited

U.S. PATENT DOCUMENTS

| | | | |
|---|---|---|---|
| 2014/0154876 A1* | 6/2014 | Tsai | H01L 21/26506 438/510 |
| 2014/0170853 A1 | 6/2014 | Shamma et al. | |
| 2014/0220757 A1* | 8/2014 | Tsai | H01L 21/823412 438/301 |
| 2015/0155176 A1 | 6/2015 | Mignot et al. | |
| 2015/0206879 A1* | 7/2015 | Cheng | H01L 27/092 257/338 |
| 2015/0287612 A1* | 10/2015 | Luere | H01L 21/0274 438/703 |
| 2016/0042952 A1* | 2/2016 | Tsai | H01L 29/6653 438/154 |
| 2016/0247680 A1* | 8/2016 | O'Meara | H01L 21/31144 |

\* cited by examiner

CYCLIC SPACER ETCHING PROCESS WITH IMPROVED PROFILE CONTROL

CROSS-REFERENCE TO RELATED APPLICATIONS

This application claims benefit to U.S. Provisional Patent Application No. 62/140,243, filed Mar. 30, 2015, the entirety of which is herein incorporated by reference.

BACKGROUND

Field

Embodiments of the preset disclosure generally relate to methods of patterning and etching a substrate. More specifically, embodiments described herein relate to a cyclic spacer etching process with improved profile control.

Description of the Related Art

In response to an increased need for smaller electronic devices with denser circuits, devices with three dimensional (3D) structures, such as fin field effect transistors (FinFETs) have been developed. Forming sub-10 nm node structures is desired but complicated by limitations and complexities associated with various patterning and lithography processes.

For example, multiple patterning processes, such as self-aligned double patterning (SADP) and self-aligned quadruple patterning (SAQP) processes, may not adequately provide reliable patterning given the small pitch size requirements associated with formation of sub-10 nm node structures. Other lithography processes, such as litho-etch-litho-etch (LELE) processes which utilize 193 nm immersion photolithography, may increase the line width roughness (LWR) of a resist used to pattern features on the substrate.

Conventional double and quadruple double patterning schemes generally involve etching of a spacer material and removal of a mandrel material to leave a mask pattern created by individual spacers. However, conventional spacer etching processes often result in asymmetric spacer profiles. For example, a footing formed near the bottom of a spacer structure may result from uneven plasma exposure and may also be influenced by polymer materials disposed on sidewalls of the spacer structures to protect the sidewalls from undesirable etching. Inconsistencies and asymmetries in spacer etching may affect pattern transfer which can result in adjacent features having inconsistent critical dimensions, depths, shapes, etc. Moreover, current lithography and patterning processes are time consuming, which reduces throughput for device processing.

Accordingly, what is needed in the art are improved patterning methods.

SUMMARY

In one embodiment, a method of patterning a substrate is provided. The method includes positioning a substrate having one or more mandrel structures and a spacer material formed thereon in a processing chamber. The spacer material may be a layer formed over the mandrel structures and the spacer material may be exposed to an inert plasma to modify one or more regions of the spacer material. The modified regions of the spacer material may be exposed to an etchant plasma to remove a portion of the spacer material, and the exposing the spacer material to an inert plasma and the exposing the modified regions of the spacer material to an etchant plasma may be repeated until a portion of the mandrel structure is exposed.

In another embodiment, a method of patterning a substrate is provided. The method includes positioning a substrate having one or more mandrel structures and a spacer material formed thereon in a processing chamber and exposing the spacer material to a biased inert plasma at a pressure of less than about 300 milliTorr (mT) to modify one or more regions of the spacer material. The modified regions of the spacer material may be exposed to an unbiased etchant plasma generated by a remote plasma source at a pressure of greater than about 500 mT to remove a portion of the spacer material. The exposing the spacer material to an inert plasma and the exposing the modified regions of the spacer material to an etchant plasma may be repeated until a portion of the mandrel structure is exposed.

In yet another embodiment, a method of patterning a substrate is provided. The method includes positioning a substrate having one or more mandrel structures and spacer material formed thereon in a processing chamber and exposing the spacer material to an inert plasma to modify one or more regions of the spacer material. The modified regions of the spacer material may be exposed to an etchant plasma to remove a portion of the spacer material and the exposing the spacer material to an inert plasma and the exposing the modified regions of the spacer material to an etchant plasma may be repeated until a portion of the mandrel structure is exposed. The mandrel structure may be etched and the exposing the spacer material to an inert plasma and the exposing the modified regions of the spacer material to an etchant plasma may be repeated until a desired spacer profile if formed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for patterning a substrate. Patterning processes, such as double patterning and quadruple patterning processes, may benefit from the embodiments described herein which include performing an inert plasma treatment on a spacer material, performing an etching process on a treated region of the spacer material, and repeating the inert plasma treatment and the etching process to form a desired spacer profile. The inert plasma treatment process may be a biased process and the etching process may be an unbiased process. Various processing parameters, such as process gas ratios and pressures, may be controlled to influence a desired spacer profile.

A substrate having mandrel structures and a spacer material layer disposed thereon may be processed according to the embodiments described herein. The inert plasma treatment process may utilize a capacitively-coupled plasma and a suitable chemistry to modify regions of the spacer material layer without removing portions of the spacer material. The inert plasma treatment process may be biased to control modification of desired regions of the spacer material layer. An unbiased etching process may utilize a capacitively-coupled plasma with a suitable process gas to etch the modified regions of the spacer material in a cyclic manner by repeating the plasma treatment and plasma etching processes until a desired spacer profile is achieved. For example, the cyclic modification and etching process may be performed to expose the mandrel structures. A mandrel recess process may also be performed and the cyclic modification and etching process may be performed subsequent to the mandrel recess to further remove remaining undesirable spacer material.

Figure 1:
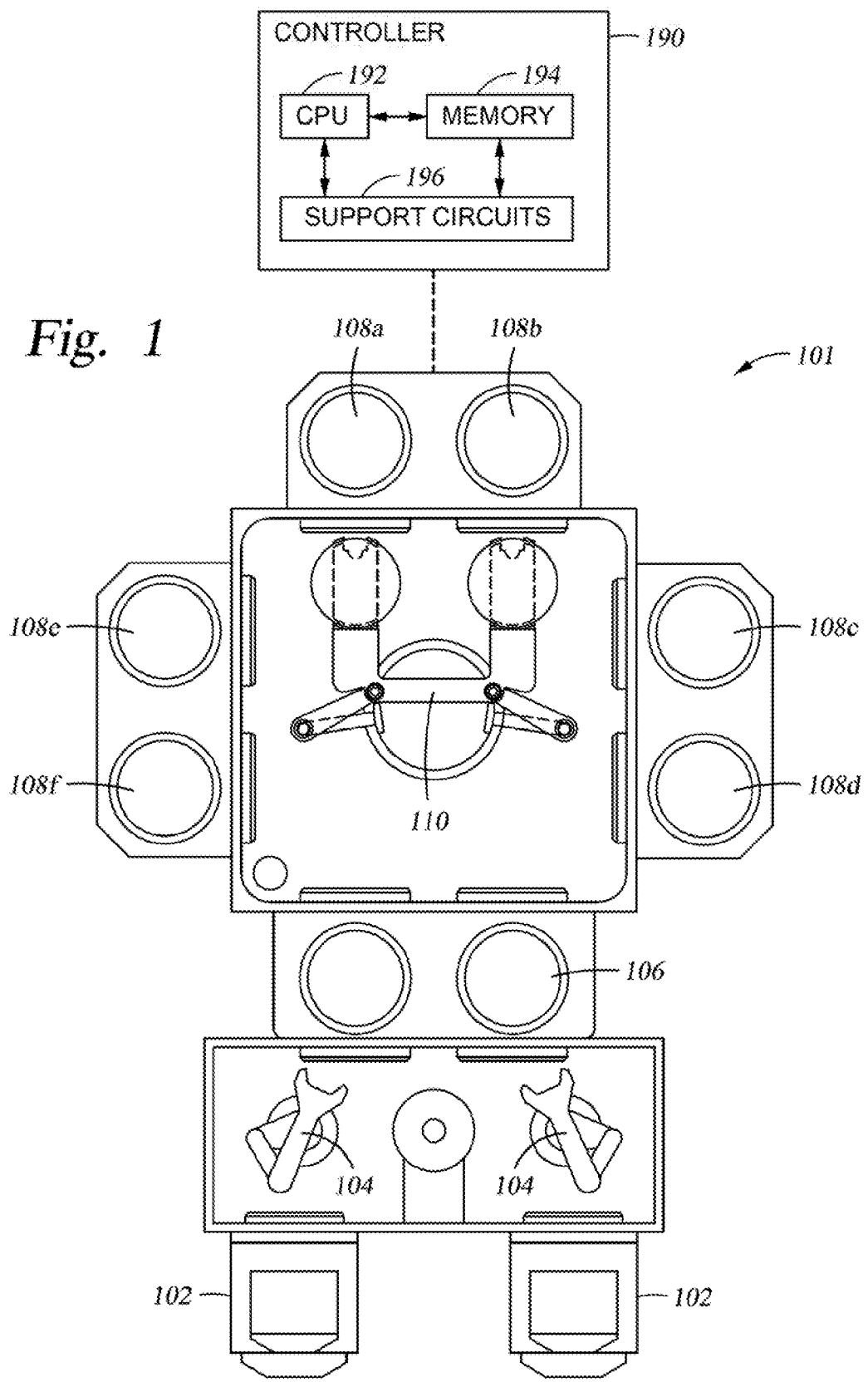
FIG. 1 illustrates a schematic, plan view of an exemplary processing system in which embodiments of the disclosure may be practiced.

FIG. 1 illustrates a schematic, plan view of a processing system 101 which may be utilized to perform the methods described herein. The processing system 101 may perform various processes, such as deposition processes, etching processes, and baking and curing processes, among others. The processing system 101 includes a pair of front opening unified pods 102. Substrates are generally provided from the front opening unified pods 102. One or more first robots 104 retrieve the substrates from the front opening unified pods 102 and place the substrates into a loadlock chamber 106. One or more second robots 110 transport the substrates from the loadlock chamber 106 to one or more processing chambers 108a-108f. Each of the processing chambers 108a-108f may be configured to perform a number of substrate processing operations, such as plasma modification, plasma etching, epitaxial layer deposition, atomic layer deposition (ALD), chemical vapor deposition (CVD), physical vapor deposition (PVD), pre-clean degas, orientation, and other substrate processes.

The substrate processing chambers 108a-108f may include one or more system components for modifying and/or etching a material deposited on a substrate. In one configuration, two pairs of the processing chambers, for example, 108c-108d and 108e-108f, may be used to modify a material on the substrate, and the third pair of processing chambers, for example, 108a-108b, may be used to remove material from the substrate. In another configuration, all of the processing chambers 108a-108f may be configured to remove material from the substrate. In this configuration, each pair of processing chambers, 108a-108b, 108c-108d, 108e-108f, may be configured to perform a selective etching process.

In one embodiment, processing chambers 108a-108b may be configured to selectively etch various spacer materials utilizing a dry plasma etching process. Processing chambers 108c-108d may be configured to selectively etch semiconducting materials, such as silicon, silicon germanium, germanium, and III-V material, utilizing a dry plasma etching process. Processing chambers 108e-108f may be configured to modify spacer materials utilizing an inert plasma modification process. In one embodiment, the processing chambers 108e-108f utilize an electron beam to form a plasma. However, other methods of forming a plasma may also be utilized. The processing system 101 described herein may be utilized to perform the processes described herein. Additionally, any one or more of the processes described herein may be performed in chamber(s) separated from the processing system 101.

The above-described processing system 101 can be controlled by a processor based system controller such a controller 190. For example, the controller 190 may be configured to control flow of various process gases and purge gases from gas sources, during different operations of a substrate process sequence. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing system 101 to facilitate control of the substrate processing. The controller 190 also includes hardware for monitoring substrate processing through sensors in the processing system 101, including sensors monitoring the process gas and purge gas flow. Other sensors that measure system parameters such as substrate temperature, chamber atmosphere pressure and the like, may also provide information to the controller 190.

To facilitate control of the processing system 101 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Material modification, etching, and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the processing system 101. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g. read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
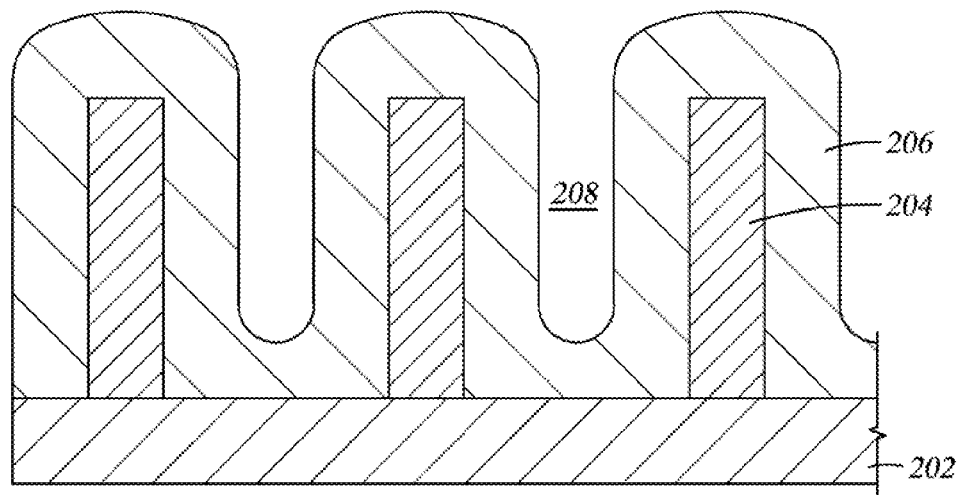
FIG. 2 illustrates a partial cross-sectional view of a substrate having mandrel structures and a spacer material formed thereon according to one embodiment described herein.

FIG. 2 illustrates a partial cross-sectional view of a substrate 202 having mandrel structures 204 and a spacer material 206 formed thereon according to one embodiment described herein. The substrate 202 may be formed from suitable materials, such as semiconducting materials, oxide materials, and the like. In other embodiments, the substrate 202 may be a material layer disposed on a substrate. The mandrels structures 204 may be formed from various materials, including silicon containing materials, III-V materials, or the like. The spacer material 206 may be formed from suitable spacer or hardmask materials, such as silicon containing materials, nitride containing materials, and the like. In certain embodiments, the spacer material 206 may be a silicon nitride material, a polysilicon material, or a titanium nitride material. It is contemplated that the materials selected for the mandrel structures 204 and the spacer material 206 may be suitable for use in the fabrication of FinFET structures. It is also contemplated that the materials selected for the mandrel structures 204 and the spacer material 206 may have different characteristics to facilitate selective etching processes.

Generally, the mandrel structures 204 may extend from the substrate 202 and the spacer material 206 may be formed in a layer over the mandrel structures 204 and the substrate 202. The spacer material 206 may be deposited by various techniques, such as chemical vapor deposition (CVD), physical vapor deposition (PVD), or other suitable processes. In one embodiment, the spacer material 206 may be predominantly conformally deposited over the mandrel structures 204 and the substrate 202. The mandrel structures 204 may be spaced apart such that when the spacer material 206 is deposited, a trench 208 may be formed between adjacent mandrel structures. In the embodiments provided below, processing parameters are generally described with regard to the processing of a 300 mm substrate, however, it is contemplated the other size substrates, such as 200 mm or 450 mm substrates, may benefit from the embodiments described herein.

Figure 3:
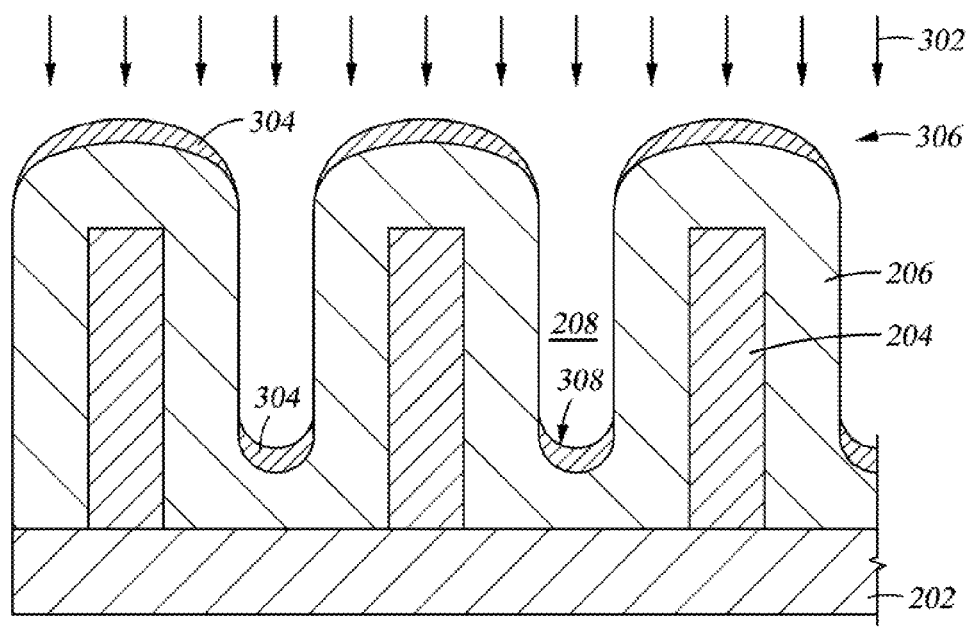
FIG. 3 illustrates a partial cross-sectional view of the substrate of FIG. 2 after performing a spacer material modification process according to one embodiment described herein.

FIG. 3 illustrates a partial cross-sectional view of the substrate 202 of FIG. 2 after performing a spacer material modification process according to one embodiment described herein. The spacer material 206 may be modified in an inert plasma modification process. The inert plasma modification process may utilize suitable chemistry to modify or alter the material properties of the spacer material 206 without removing the spacer material 206. For example, the physical structure or the chemical make-up of the spacer material 206 may be altered after exposure to an inert plasma 302. In one embodiment, the spacer material 206 is exposed to the inert plasma 302 to form modified regions 304 of the spacer material. The modified regions 304 of the spacer material 206 are generally located at a top region 306 above the mandrel structure 204 and a bottom region 308 within the trench 208. The inert plasma may be generated by a remote plasma source or may be generated in situ in the processing chamber. The inert plasma generation process may be an inductively coupled plasma process or a capacitively-coupled plasma process. Generally, a bias may be utilized during the inert plasma modification process to influence directionality of the plasma with regard to the spacer material 206. Suitable process gases for forming the inert plasma 302 include noble gases, $H_2$, $N_2$, $O_2$, and $NH_3$, among others.

Various processing parameters may also be controlled during the inert plasma modification process. For example, a capacitively-coupled bias power may be between about 10 W and about 1500 W, such as between about 50 W and about 200 W, for example, about 100 W. A pressure in the processing chamber during the inert plasma modification process may be maintained between about 3 mT and about 300 mT, such as between about 10 mT and about 100 mT, for example, about 20 mT.

In one embodiment, polysilicon may be utilized as the spacer material 206 and a noble gas (He, Ne, Ar, Kr, Xe, Rn) may be utilized as a processing gas to modify the spacer material 206. In another embodiment, silicon nitride may be utilized as the spacer material 206 and a He or $H_2$ process gas may be utilized to modify the spacer material 206. In an embodiment utilizing He process gas, the He process gas may be provided to the process chamber at a flow rate of between about 300 sccm and about 900 sccm, such as about 600 sccm. The inert plasma modification process may be performed for a suitable amount of time to modify a desirable amount of spacer material 206.

Figure 4:
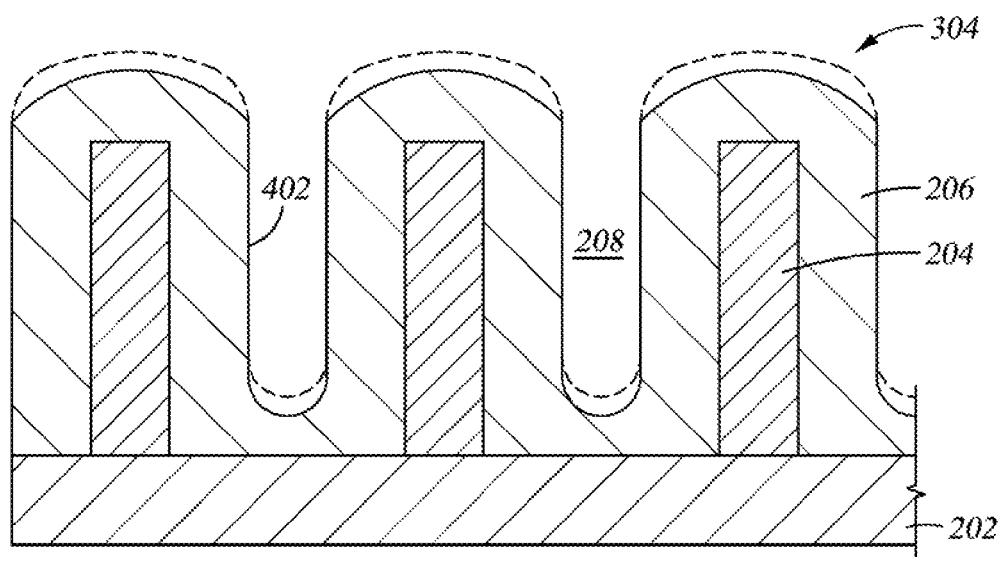
FIG. 4 illustrates a partial cross-sectional view of the substrate of FIG. 3 after performing an etching, process according to one embodiment described herein.

FIG. 4 illustrates a partial cross-sectional view of the substrate 202 of FIG. 3 after performing an etching process according to one embodiment described herein. The etching process may be performed to remove the modified regions 304 formed in the inert plasma modification process. The removed modified regions 304 are illustrated in FIG. 4 as dashed lines, indicating where the modified regions 304 existed prior to removal during the etching process. The etching process is configured to expose the modified regions 304 to an etchant plasma which is selective to the modified regions 304 as opposed to sidewalls 402 of the spacer material 206.

In one embodiment, the etchant plasma may be generated by a remote plasma source. The etchant plasma may be unbiased and the etching characteristics may be predominantly isotropic. However, the process gas chemistry utilized to form the etchant plasma may be configured to selectively remove the modified regions 304 relative to other regions of the spacer material 206, such as the sidewalls 402. Various process gases suitable for forming the etchant plasma include $NF_3$, $NH_3$, $N_2$, $H_2$, $H_2O_2$, $O_2$, $Cl_2$, $F_2$, and combinations and mixtures thereof. The process gases formed into the etchant plasma may be provided to the processing chamber in the presence of a carrier gas, such as He or Ar.

A power suitable for etchant plasma generation by a remote plasma source may be between about 10 W and about 2000 W, such as between about 20 W and about 100 W, for example, about 40 W. A pressure in the processing chamber during the etchant plasma process may be maintained between about 500 mT and about 10 T, such as between about 1000 mT and about 2000 mT, for example, about 1500 mT. In one embodiment, a silicon nitride spacer material modified with a He inert plasma may be etched by a combination of $NF_3$ and $NH_3$ process gases carried by He gas. In this embodiment, a ratio of $NF_3$:$NH_3$:He may be between about 1:10:333. A flow rate of the $NF_3$ process gas may be between about 1 sccm and about 100 sccm, such as between about 25 sccm and about 50 sccm, for example, about 30 sccm. A flow rate of the $NH_3$ process gas may be between about 100 sccm and about 1000 sccm, such as between about 200 sccm and about 400 sccm, for example, about 300 sccm. A flow rate of the He carrier gas may be between about 100 sccm and about 5000 sccm, such as between about 500 sccm and about 2000 sccm, for example, about 1000 sccm.

As a result of exposure of the modified regions 304 of the spacer material 206 to the etchant plasma, the modified regions 304 may be removed. It is contemplated that less than an entire desirable amount of spacer may be removed after performing the inert plasma modification process and the etchant plasma material removal process. Accordingly, the inert plasma modification process and the etchant plasma material removal processes may be repeated in a cyclic manner until the mandrel structure in exposed or until a desired profile of the spacer material 206 is formed. It is contemplated that the process may be cycled one or more times, for example, between about 2 times and about 100 times. If the cyclic material modification and etching process form a desired spacer profile, the substrate may by subsequently processed by various other substrate processing operations.

Figure 5:
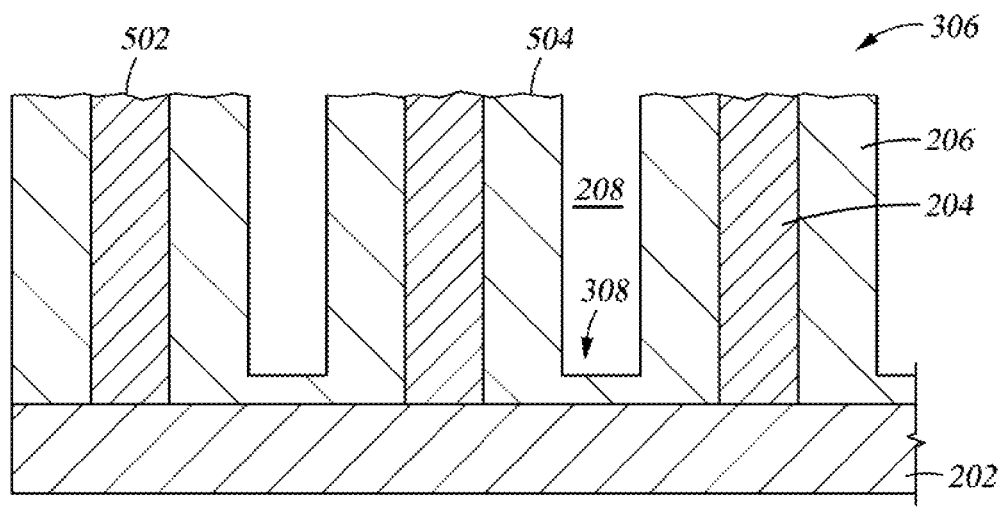
FIG. 5 illustrates a partial cross-sectional view of the substrate of FIG. 4 after performing a cyclic spacer material removal process according to, one embodiment described herein.

FIG. 5 illustrates a partial cross-sectional view of the substrate 202 of FIG. 4 after performing a cyclic spacer material removal process according to one embodiment described herein. Occasionally, the spacer material cyclic removal process may not remove all of the desired spacer material 206 after cyclic processing. For example, some spacer material 206 may remain on the substrate 202 in the trench 208 at the bottom region 308. It is believed that spacer material disposed in the top region 306 may be etched and removed more quickly in, the cyclic spacer material removal process when compared to spacer material removal within the trench 208. In this example, the spacer material 206 may be etched by the cyclic material removal process until a top surface 502 of the mandrels structures 204 is exposed and/or is substantially coplanar with a top surface 504 of the spacer material 206. It is believe that by controlling the pressure during the plasma etching operation of the cyclic spacer material removal process, the profile of the top surface 504 may be predominantly planar.

Figure 6:
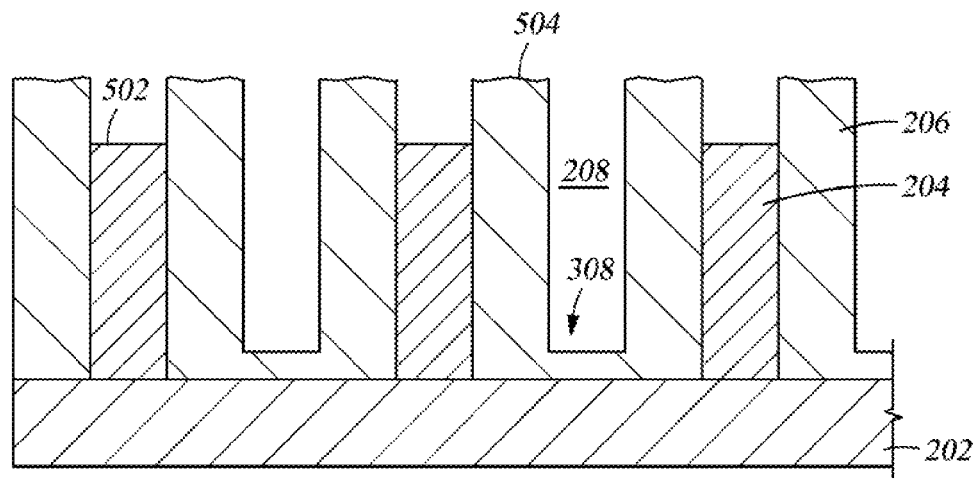
FIG. 6 illustrates a partial cross-sectional view of the substrate of FIG. 5 after performing a mandrel structure etching process according to one embodiment described herein.

FIG. 6 illustrates a partial cross-sectional view of the substrate 202 of FIG. 5 after performing a mandrel structure etching process according to one embodiment described herein. In order to remove spacer material 206 remaining in the bottom region 308 of the trench 208, the cyclic spacer material removal process may be performed again. However, to further control the profile of the spacer material 206, the mandrel structures 204 may be etched to influence the plasma exposure during modification and etching by reducing the probability of asymmetric plasma exposure to the spacer material 206 at the top region 306.

The mandrel structures 204, which generally comprise a silicon containing material, may be etched by a combination of $NF_3$ and $NH_3$ process gases carried by He gas. In this embodiment, a ratio of $NF_3$:$NH_3$:He may be about 1:5:20. A flow rate of the $NF_3$ process gas may be between about 1 sccm and about 100 sccm, such as between about 25 sccm and about 50 sccm, for example, about 30 sccm. A flow rate of the $NH_3$ process gas may be between about 50 sccm and about 1000 sccm, such as between about 100 sccm and about 300 sccm, for example, about 150 sccm. A flow rate of the He carrier gas may be between about 100 sccm and about 5000 sccm, such as between about 400 sccm and about 1500 sccm, for example, about 600 sccm.

After etching the mandrel structures 204, the top surface 502 of the mandrel structures 204 may be recessed below the top surface 504 of the spacer material 206.

Figure 7:
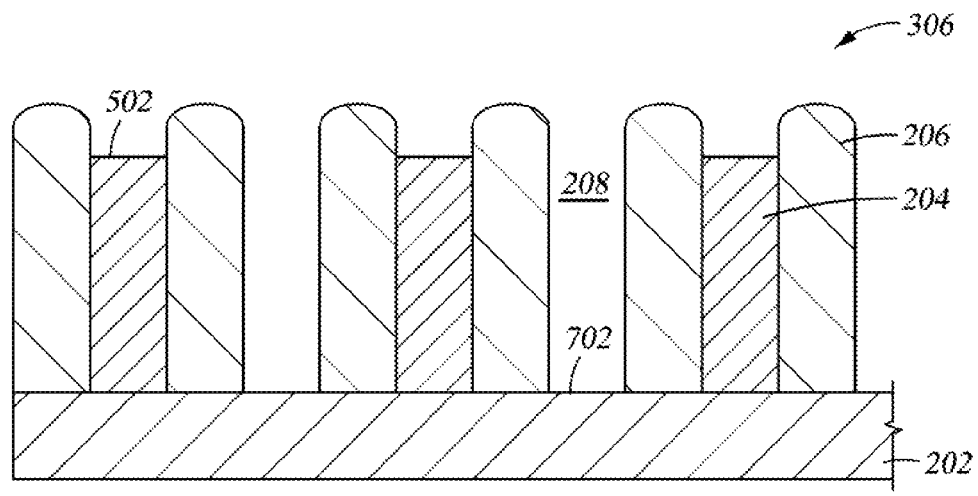
FIG. 7 illustrates a partial cross-sectional view of the substrate of FIG. 6 after performing the cyclic spacer material removal process according to one embodiment described herein.

FIG. 7 illustrates a partial cross-sectional view of the substrate 202 of FIG. 6 after performing the cyclic spacer material removal process according to one embodiment described herein. The cyclic spacer material removal process may be performed to remove any remaining undesirable spacer material 206, such as the spacer material 206 remaining on the substrate 202 in the bottom region 308 of the trench 208 as illustrate in FIG. 8. The cyclic spacer material removal process, described in detail with regard to FIGS. 3 and 4, may be performed for a suitable number of cycles to expose a top surface 702 of the substrate 202 and form a desirable spacer material profile. In certain embodiments, the top surface 504 of the spacer material 206 may have a planar profile or a rounded profile, depending on the pressure maintained within the processing chamber when performing the spacer material etching process.

Figure 8:
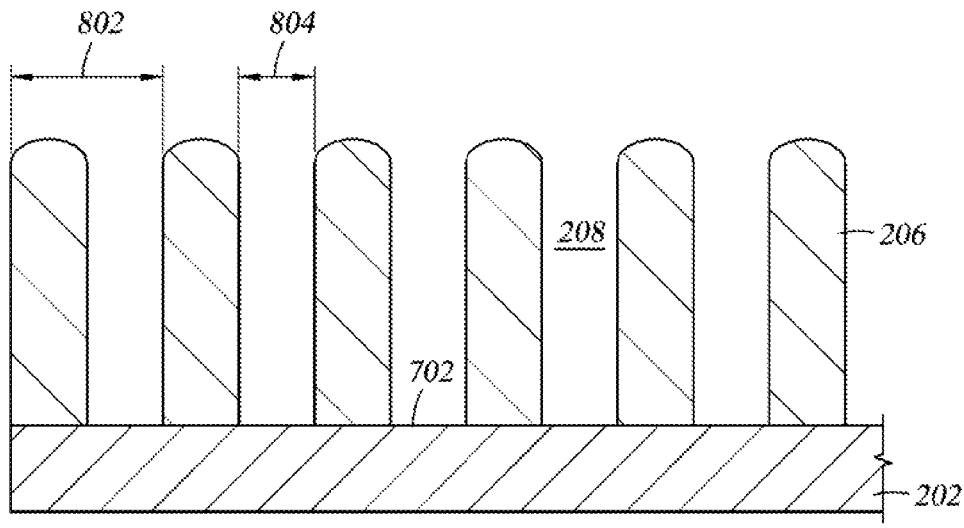
FIG. 8 illustrates a partial cross-sectional view of the substrate of FIG. 7 after performing a mandrel structure removal process according to one embodiment described herein.

FIG. 8 illustrates a partial cross-sectional view of the substrate 202 of FIG. 7 after performing a mandrel structure removal process according to one embodiment described herein. After the desired spacer material profile has been formed utilizing the cyclic spacer material removal process, the mandrel structures 204 may be removed. A mandrel material etching process, described with regard to FIG. 6, or other suitable process may be utilized to remove the mandrel structures 204 from the substrate 202.

A pitch 802 of the features formed by the spacer material 206 may be between about 10 nm and about 40 nm, such as about 20 nm. Similarly, a critical dimension 804 of the spacer material features may be less than about 10 nm. Subsequent etching processes may be performed to transfer the pattern formed by the spacer material features to other material layers of the substrate 202.

Figure 9:
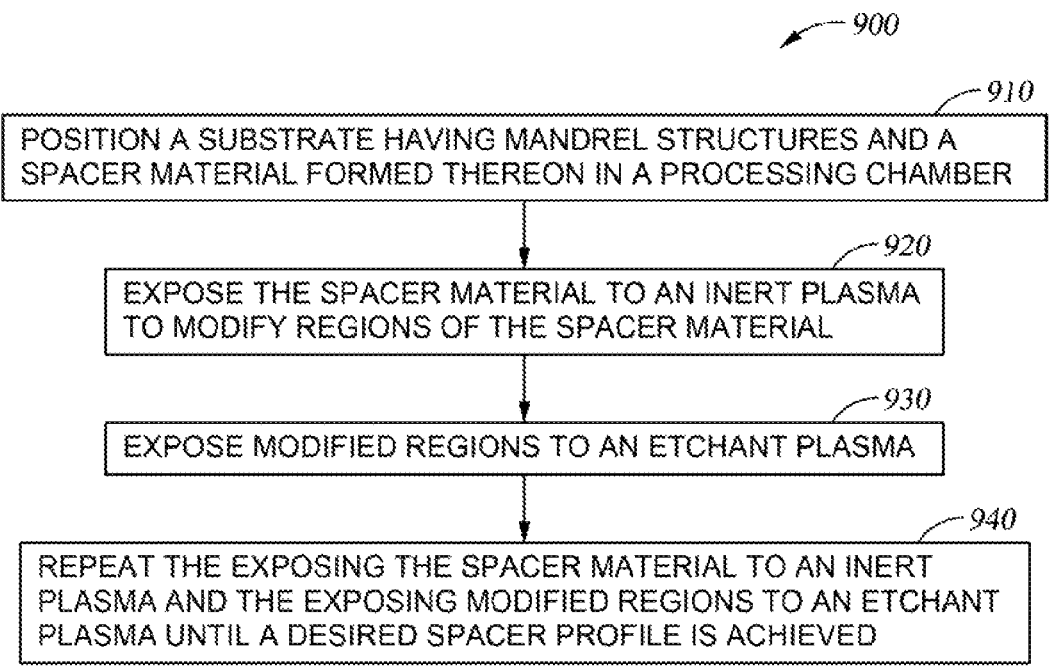
FIG. 9 illustrates a flow diagram of a method for processing a substrate according to embodiments described herein.

FIG. 9 illustrates a flow diagram of a method 900 for processing a substrate according to embodiments described herein. At operation 910, a substrate having mandrel structures and a spacer material formed thereon may be positioned in a processing chamber. The processing chamber may be a chamber suitable for performing plasma modification and plasma etching processes, such as the chamber 101 described in FIG. 1. At operation 920, the spacer material may be exposed to an inert plasma to modify regions of the spacer material.

At operation 930, the modified regions of the spacer material maybe exposed to an etchant plasma. In one embodiment, operation 920 may be performed in a first processing chamber, such as chambers 108e-108f, and operation 930 may be performed in a second processing chamber, such as chambers 108a-108b. Transfer of the substrate between the first processing chamber and the second processing chamber may be performed in a vacuum environment, such as through a transfer chamber. Alternatively, operations 920 and 930 may be performed in a single chamber.

At operation 940, operations 920 and 930 may be repeated until a desired spacer material profile is achieved. By separating the modification and etching processes and controlling various processing conditions directionality of the etching process may be improved and may result in an improved spacer material profile. For example, a substantially flat or rounded spacer material profile may be achieved in conjunction with recessing the mandrel to avoid asymmetric plasma exposure.

Moreover, spacer material footings may be avoided or reduced because a polymer protective layer to protect sidewalls of the spacer material is not needed as a result of the improved spacer material etching control when utilizing the cyclic spacer material removal processes described herein. Thus, multiple patterning processes may benefit from the embodiments described herein and sub-10 nm node structures may be patterned more effectively.

While the foregoing is directed to embodiments of the present disclosure, other and further embodiments of the disclosure may be devised without departing from the basic scope thereof, and the scope thereof is determined by the claims that follow.

What is claimed is:

1. A method of patterning a substrate, comprising:
 positioning a substrate having one or more mandrel structures and a spacer material formed thereon in a processing chamber, wherein the spacer material is a layer formed over the mandrel structures;
 exposing the spacer material to a treatment plasma generated from a gas mixture including at least $NH_3$ gas to modify one or more regions of the spacer material;
 exposing the modified regions of the spacer material to an etchant plasma to remove a portion of the spacer material; and
 repeating the exposing the spacer material to a treatment plasma and the exposing the modified regions of the spacer material to an etchant plasma until a portion of the mandrel structure is exposed.

2. The method of claim 1, wherein the one or more mandrel structures comprise a silicon containing material.

3. The method of claim 1, wherein the spacer material comprises a nitride containing material, an oxide containing material, a polysilicon material, a titanium nitride material, or combinations thereof.

4. The method of claim 1, wherein a processing gas utilized to form the etchant plasma is selected from the group consisting of $H_2$, $N_2$, $H_2O_2$, $NF_3$, $NH_3$, $Cl_2$, $F_2$, and combinations and mixtures thereof.

5. The method of claim 1, wherein exposing the spacer material to the treatment plasma further comprises:
 biasing the substrate.

6. The method of claim 5, wherein the biasing the substrate is performed at a power of between about 10 W and about 1500 W.

7. The method of claim 5, wherein the exposing the spacer material to the treatment plasma is performed at a pressure of between about 5 mT and about 300 mT.

8. The method of claim 1, wherein the etchant plasma exposure is unbiased and the etchant plasma is generated by a remote plasma source.

9. The method of claim 8, wherein a power utilized to generate the etchant plasma from the remote plasma source for a 300 mm substrate is between about 20 W and about 2000 W.

10. The method of claim 8, wherein the etchant plasma exposure is performed at a pressure of between about 500 mT and about 10T.

11. A method of patterning a substrate, comprising:
 positioning a substrate having one or more mandrel structures and a spacer material formed thereon in a processing chamber;
 exposing the spacer material to a biased treatment plasma generated from a gas mixture including at least $NH_3$ gas at a pressure of less than about 300 mT to modify one or more regions of the spacer material;
 exposing the modified regions of the spacer material to an unbiased etchant plasma generated by a remote plasma source at a pressure of greater than about 500 mT to remove a portion of the spacer material; and
 repeating the exposing the spacer material to the treatment plasma and the exposing the modified regions of the spacer material to an etchant plasma until a portion of the mandrel structure is exposed.

12. The method of claim 11, wherein the exposing the exposing the spacer material to the biased treatment plasma and the exposing the modified region of the spacer material to an unbiased etchant plasma are performed in a single chamber.

13. The method of claim 11, wherein the exposing the exposing the spacer material to a biased treatment plasma is performed in a first processing chamber and the exposing the modified region of the spacer material to an unbiased etchant plasma is performed in a second processing chamber.

14. The method of claim 13, wherein the substrate is transferred from the first processing chamber to the second processing chamber without breaking vacuum.

15. A method of patterning a substrate, comprising:
 positioning a substrate having one or more mandrel structures and a spacer material formed thereon in a processing chamber;
 exposing the spacer material to a treatment plasma generated from a gas mixture including at least $NH_3$ gas to modify one or more regions of the spacer material;
 exposing the modified regions of the spacer material to an etchant plasma to remove a portion of the spacer material;
 repeating the exposing the spacer material to a treatment plasma and the exposing the modified regions of the spacer material to an etchant plasma until a portion of the mandrel structure is exposed;
 etching the mandrel structure; and
 repeating the exposing the spacer material to a treatment plasma and the exposing the modified regions of the spacer material to an etchant plasma until a desired spacer profile is formed.

16. The method of claim 15, wherein exposing the spacer material to the treatment plasma further comprises:
 biasing the substrate.

17. The method of claim 16, wherein the etchant plasma exposure is unbiased and the etchant plasma is generated by a remote plasma source.

* * * * *